United States Patent [19]

Ohta et al.

[11] Patent Number: 5,308,651

[45] Date of Patent: May 3, 1994

[54] PHOTOCHEMICAL VAPOR DEPOSITION PROCESS

[75] Inventors: Tomohiro Ohta; Hiroaki Sasaki; Tohru Mitomo; Naoki Kubota, all of Chiba, Japan

[73] Assignee: Kawasaki Steel Corp., Japan

[21] Appl. No.: 973,058

[22] Filed: Nov. 6, 1992

Related U.S. Application Data

[63] Continuation of Ser. No. 665,598, Mar. 6, 1991, abandoned, which is a continuation of Ser. No. 204,552, Apr. 19, 1988, abandoned.

[30] Foreign Application Priority Data

| Dec. 25, 1986 | [JP] | Japan | 61-308049 |
| Aug. 12, 1987 | [JP] | Japan | 62-199984 |
| Aug. 12, 1987 | [JP] | Japan | 62-199985 |

[51] Int. Cl.⁵ .................................. B05D 3/06
[52] U.S. Cl. .................................. 427/582; 427/583; 427/584
[58] Field of Search ............... 427/582, 583, 584, 586, 427/561

[56] References Cited

U.S. PATENT DOCUMENTS

| 4,579,750 | 4/1986 | Bowen et al. | 427/586 |
| 4,581,249 | 4/1986 | Kamiya | 427/583 |
| 4,608,117 | 8/1986 | Ehrlich et al. | 427/53.1 |
| 4,626,449 | 12/1986 | Hirai et al. | 427/583 |
| 4,655,849 | 4/1987 | Schachameyer et al. | 427/53.1 |
| 4,661,679 | 4/1987 | Pardee | 427/53.1 |
| 4,782,035 | 11/1988 | Fujiwara | 427/596 |
| 5,112,647 | 5/1992 | Takabayashi | 427/583 |

FOREIGN PATENT DOCUMENTS

| 59-82732 | 5/1984 | Japan . |
| 59-94829 | 5/1984 | Japan . |
| 140368 | 8/1984 | Japan . |
| 215731 | 12/1984 | Japan . |
| 150655 | 2/1986 | Japan . |

OTHER PUBLICATIONS

Boyer et al., "Laser-induced CVD of SiO₂", *Appl. Phys. Lett.* 40(5) Apr. 15, 1982 pp. 716–718.

*Primary Examiner*—Marianne Padgett
*Attorney, Agent, or Firm*—Bierman and Muserlian

[57] ABSTRACT

As to technical subject matters of attempting increase of deposition rate and improvement of film quality and removing restriction of light source and source gas in the photo CVD process, the promotion of photolysis of the source gas is achieved by use of a pulse laser beam together with a continuous light, application of plural laser beams wherein each pulse of at least one second pulse laser beam is irradiated into each interval between a pulse and the next pulse in a first lase beam, and further introduction of an additive gas in addition to the source gas into a reaction vessel and particularly the provision of photo CVD process advantageously adaptable for the production of semiconductor is realized.

2 Claims, 4 Drawing Sheets

PHOTOCHEMICAL VAPOR DEPOSITION PROCESS

PRIOR APPLICATIONS

This application is a continuation of U.S. patent application Ser. No. 665,598 filed Mar. 6, 1991 which is a continuation of U.S. patent application Ser. No. 204,552 filed Apr. 19, 1988, both now abandoned.

TECHNICAL FIELD

This invention relates to a photochemical vapor deposition process (hereinafter referred to as photo CVD process) for forming a film through a photolytical reaction.

BACKGROUND ART

The photo CVD process is a main means for the formation of thin film among low temperature processes and restrains the interdiffusion at the surface without damaging the substrate, so that it is for the formation of amorphous silicon films for solar cell (hereinafter referred to as a-Si film), or diamond-like carbon thin films and carbon films having a diamond structure (hereinafter referred to as diamond film) expected as a high functional material having simultaneously high hardness, high thermal conductivity, high insulation property and the like, or thin films of silicon carbide, silicon nitride and silicon dioxide used as or applicable for semiconductor devices.

Since such thin films play an important part in the modern industry, film formation processes represented by PVD process (Physical Vapor Deposition process) and CVD process (Chemical Vapor Deposition process) have been recently developed and applied and practised in various fields.

Among them, photo CVD process wherein a source gas is in the vicinity of a substrate and is subjected to photolysis and then the resulting active chemical species are deposited onto the substrate is important as one of low temperature processes causing no damage to the substrate and inducing no unnecessary interdiffusion at the surface.

As a light source for the photo CVD process, there are generally two kinds of continuous light and discontinuous light (pulse beam).

The former case includes a low pressure mercury lamp, a high pressure mercury lamp, a deuterium lamp, a xenon lamp, an Ar ion laser and the like. These continuous light sources have a drawback that the deposition rate is very slow because a light of absorption range which induces excitation causing photolytic process inherent to the source gas is not emitted, or if a light of a wavelength existing in this absorption range is emitted, the power thereof is weak.

The photo CVD process has a merit capable of forming films in a low temperature process, which is never achieved in the other film forming processes, but there are problems to be solved, such as small deposition rate and poor film quality in the photo CVD process using the continuous light. .Therefore, there have been proposed various methods for solving these problems.

The proposed techniques are as follows.

(1) Method wherein laser beams are focused and irradiated to a reactive gas from two or more different directions to expect local multiphoton dissociation process (Japanese Patent laid open No. 61-96,725).

As shown in FIG. 1, this method is performed by placing a substrate 5 in a reaction chamber 1 provided with a light irradiation window 2, introducing a gas from an inlet 3 and irradiating two laser beams 7, 8 from different directions to a point P on the substrate.

(2) Method of synthesizing a thin film by simultaneously introducing plural source gases into a CVD reaction chamber and simultaneously irradiating lights of plural wavelengths matched with the absorption spectrum of each gas (Japanese Patent laid open No. 60-206,445).

(3) Method wherein lights of two different wavelengths are simultaneously irradiated into a CVD reaction chamber to cause decomposition of a source gas through a light of a first wavelength and successively decompose the resulting decomposed products through a light of a second wavelength (Japanese Patent laid open No. 62-7,122).

(4) Method wherein a laser beam is irradiated in parallel to a substrate surface to cause photolysis of a source gas and another laser beam is irradiated to the substrate to heat the substrate for increasing the deposition rate (Japanese Patent laid open No. 61-30,028) or cause excitation of the substrate for increasing the deposition rate (Japanese Patent laid open No. 61-108,130).

In these methods using the continuous light, the deposition rate is small only with the single continuous light, so that it is intended to improve the deposition rate by adding another continuous light. However, the energy of the continuous light is generally low, so that the expected effect is not obtained by using only the continuous light source.

On the other hand, in the method using a strong discontinuous light source represented by an excimer laser or the like having a high energy, a slightly large deposition rate can be realized when using a source gas having a large absorption cross section, but it is difficult to form a thin film having a good film quality because powder is undesirably produced.

The most serious drawback of the excimer laser is that it is a pulse light source, so that there are disadvantages that the half-width of pulse is not more than 20 ns and the pulse repeating number is restricted. That is, the effective time causing the photolytic reaction actually contributing to the formation of films is very short in a time required for the film formation. For example, when a duration time of one pulse beam is 20 ns, even if the beam is irradiated at 100 Hz for 1 hour, the beam irradiated time is only $7.2 \times 10^{-3}$ seconds ($20 \times 10^{-9} \times 100 \times 60 \times 60 = 7.2 \times 10^{-3}$). Since the beam of high energy is irradiated for a very short time, the degradation of the film quality inclusive of production of powder is brought about. On the other hand, when using a source material of poor photochemical reactivity for controlling the production of powder, the deposition rate lowers and at the same time a greater part of the source gas is discharged as an unreacted state.

Under the same irradiation conditions, the irradiation time of not more than 20 ns and the non-irradiation time longer by 1,000,000 times than the irradiation time, i.e. 10 ms are repeated, so that the concentration of radicals produced largely changes between a pulse and the next pulse and consequently the main elementary reaction is different depending on the time and the reaction occurs at a non-steady state. That is, the preferable reaction for the film formation proceeds for a certain time, while particles are formed for another certain time to mainly cause the reaction degrading the film quality, whereby the degradation of the film quality is caused in the CVD process using the pulse laser beam.

In addition to problems relating to the light irradiating process as mentioned above, the conventional photo CVD processes have problems as mentioned below For instance, if it is intended to produce a-Si film, diamond film or the like by using the conventional photo CVD process based on direct photolysis of the source gas, it is necessary to provide a light source of a wavelength capable of being absorbed by the particular source gas or to prepare a source gas capable of being subjected to a photolysis by the particular light source.

However, even if the light source suitable for the particular source gas is existent, since the decomposition quantum efficiency of the source gas decomposed by this light source is inherent to this gas, it is impossible to promote the film forming reaction exceeding the above quantum efficiency. This is a drawback in the conventional photo CVD process.

For example, if it is intended to produce a-Si film, since $SiH_4$ having an absorption end of 170 nm is not decomposed by the commercially available lamp light, it is necessary to decompose an expensive source gas of $Si_2H_6$ having a shifted absorption end of 200 nm by a light of an excimer laser having a wavelength of 143 nm, resulting in the rise of cost and the degradation of the film quality.

Moreover, the film formation can be also carried out by a combination of a mercury lamp and $SiH_4$, but in this case, it is necessary to adopt a so-called mercury sensitization process wherein Hg vapor is mixed with the source gas.

That is, a Hg atom is excited by a light from the mercury lamp and collides with $SiH_4$ molecule to cause energy transfer from the Hg atom, whereby Si-H bonds in $SiH_4$ are cut to form a-Si film onto the substrate. In the mercury sensitization process, however, Hg atom is included in the film, resulting in a large cause of degrading the film quality of the a-Si film.

On the other hand, if it is intended to produce diamond film, when using $CH_4$ (absorption end 160 nm) as a source gas, it is not decomposed even if a practicable light source having a shortest wavelength of 193 nm is used alone, but it is first possible to form a film by using, for example, $F_2$ excimer laser beam of vacuum ultraviolet region (wavelength 157 nm). However, the pulse energy of the laser beam having a wavelength of 157 nm is as small as about 10 mJ/pulse and is about 1/10~1/20 as compared with the case of a light having the other wavelength, and also this wavelength is large in the absorption by air and difficult in handling, so that it is unpratical.

Furthermore, when a source gas having a weak or no one-photon absorption process is used to perform the film formation at a practical wavelength of 193 nm, as disclosed in Japanese Patent laid open No. 60-112,697, the decomposition should be carried out by two-photon absorption at a region having an energy density raised by focusing of the beam, so that the film forming area is restricted and the deposition rate becomes small.

Similarly, Japanese Patent laid open No. 60-146,791 has proposed the use of a gas such as acetylene, ethylene or the like as a source gas decomposed at the wavelength of 193 nm, but the use of such gas is unpratical because the deposition rate is restricted.

As mentioned above, the photo CVD process has a merit that it is a low temperature process and a demerit that the deposition rate inherent to photo CVD is small, so that the excimer laser beam having a strong light emission in the ultraviolet region is frequently used in order to overcome this demerit. However, the excimer laser beam is emitted in a series of pulses because of restricting the oscillation mechanism and electric circuits, while there is a limitation in rising its frequency.

Therefore, there are two great disadvantages in the photo CVD process using the pulse laser beam as a light source, which results from the above restriction.

That is, the first case is that the effective time of light irradiation is small and hence the waste of the source gas is large. The second case is that the reaction is rendered into a non-steady state to cause a so-called "disturbance of reaction" and hence the film quality is degraded.

It is an object of the invention to avoid the reduction of decomposition rate of the source gas resulted from an extremely short irradiation time in the film formation through the photo CVD process using a pulse ultraviolet laser of a large power and hence improve the small deposition rate.

It is another object of the invention to increase the deposition rate to thereby improve the film quality by taking a means for minimizing the "disturbance of reaction" resulted from the extreme change of radical concentrations between a pulse and the next pulse.

Here, it is important to attempt the improvement of the film quality by stably and continually conducting photochemical reaction in the vapor phase near to the substrate or on the substrate itself or in the film layer formed on the substrate even in a non-irradiated time between a pulse and the next pulse.

On the other hand, the most fundamental problem in the photo CVD process lies in that the source gas suitable for the film formation is not necessarily adaptable to the practical light source.

That is, the preferable source gas is not necessarily decomposed by absorbing a light from the practical light source, or inversely, there is existent no effective source gas suitable for excitation and decomposition by the light source.

Moreover, even when the proper source gas is decomposed by the practical light source, if the absorption cross section of the source gas for the wavelength is small, photons are hardly absorbed by gas molecules, so that it is disadvantageous for economical reasons. Further, in the process of excitation and decomposition of particular source gas, there is an upper limit of quantum efficiency of decomposition resulted from the combination of elementary reactions, so that the yield exceeding the upper limit is not expected and further developing the efficiency of the process is impossible.

That is, all of the conventional photo CVD processes perform the decomposition of the source gas itself by the light itself, so that they have a problem that the source gas, light source and film forming area are subjected to a great restriction in practical use.

Now, the other object of the invention is to provide a photo CVD process enabling the use of inexpensive source gas which realizes the application of a light source irrespective of the wavelength value of light absorption end of the source gas and the improvement of the film quality and deposition rate.

DISCLOSURE OF THE INVENTION

As mentioned above, in order to overcome the drawback that the deposition rate inherent to the photo CVD process is small, the excimer laser beam having a strong light emission at the ultraviolet region was used, but the excimer laser beam was emitted in a series of pulses because of restricting the oscillation mechanism and electric circuits for the excimer laser and also the frequency thereof was restricted.

On the other hand, in case of the continuous light, the deposition rate is small, but the good film quality is obtained. For example, when $SiH_4$ is subjected to photolysis through a low pressure mercury lamp, a-Si film having a good film quality is obtained.

Among these differences therebetween, the difference of the deposition rate results from a fact that in the pulse laser beam, a light having a great energy can locally be irradiated to a restricted portion to thereby raise the decomposition rate of the source gas, while it is difficult in the mercury lamp or the like.

Furthermore, the difference of the film quality results from a fact that in the mercury lamp or the like, the reaction inside the CVD reaction chamber becomes at a steady state because of the irradiating the continuous light and is not dependent upon the time as far as parameters in CVD are not changed, while the disturbance of reaction occurs one each pulse irradiation in the pulse beam.

The disturbance of reaction generated when using the pulse laser beam will be described with reference to FIG. 2 below.

FIG. 2(a) schematically shows a change of light intensity with the lapse of time when irradiating a typical excimer laser beam of 100 Hz as a photo CVD process using a pulse laser beam. In general, the pulse width is not more than 20 ns and the pulse interval is 10 ms, so that the light irradiation is merely performed in a time corresponding to only about a millionth of the pulse interval. Calculating under this condition, even when one hour is taken for the film formation, the effective time for the light irradiation is $7 \times 10^{-3}$ second and is less than 1 second as a whole.

During this irradiation, the source gas is flown at a given rate, so that the amount of the source gas effectively utilized is very low likewise the above effective light irradiation time. Furthermore, the concentration of radicals produced as a result of the photochemical reaction induced by the short pulse beam can be schematically depicted in FIG. 2(b) as plotted to the time.

Namely, the dissociation reaction of chemical bond through absorption of light occurs immediately after the light absorption, so that the concentration of radicals primarily produced becomes maximum from a last half of the pulse irradiation to just after the irradiation and gradually reduces and finally the period existing no radical is present in about 1/10 of a period between pulses because the life of the radicals under the conventional CVD condition is not more than few ms.

Noting the reactions generated in the vapor phase, radical-radical reaction mainly occurs in a portion having a high radical concentration as shown in FIG. 2(c), so that stable vapor compounds are produced by the recombination reaction or another radical species are secondarily produced by the rearrangement reaction. As the radical concentration at the light irradiation region reduces, radical-molecule reaction mainly occurs together with transfer and diffusion of the source gas as shown in FIG. 2(d). The reaction contributing to the film formation proceeds in competition with the above two reactions, so that such a film forming reaction is not constant between a pulse and the next pulse, resulting in the ununiformity of the film quality.

That is, the degradation of the film quality through the photo CVD process using the pulse beam results from that since the time for the photolytical reaction is very short and the time for the dark reaction is longer by 1,000,000 times as compared therewith, the concentration and kind of radicals produced in the CVD reaction chamber are different and the ratio of each elementary reaction to the overall reaction differs in accordance with the time after the pulse irradiation and consequently the film formation is carried out at a so-called non-steady state.

Therefore, the aforementioned drawbacks can be overcome by continuing the photochemical reaction during the time between a pulse and the next pulse.

In general, the output of the excimer laser beam is about 10~30 watts every single wavelength, while the high pressure mercury lamp of 1 kilowatt has an output of about 10 watts at a wavelength range of 240~600 nm. Therefore, when a proper source gas is selected, the photochemical reaction can continuously be produced even excepting the restricted time of irradiating the pulse laser beam.

The invention is based on the above knowledges. That is, a first aspect of the invention is characterized in that a pulse laser beam of the ultraviolet to visible region having a large output is irradiated inside a CVD reaction vessel placing a substrate therein and introducing a source gas thereinto, whereby the source gas is decomposed to produce an active chemical species of the vapor phase to be deposited onto the substrate to thereby conduct the film formation on the substrate, and at the same time a light emitted from a continuous light source having a large output is irradiated to the source gas.

The term "source gas" used herein means a gas containing a component for the film to be formed, and the term "active chemical species of the vapor phase" means an activated chemical species such as radicals, ions or the like.

Furthermore, a second aspect of the invention is characterized in that the light emitted from the continuous light source of the first invention is irradiated to the substrate or the film layer formed on the substrate.

Now, the effective time of light irradiation in the film formation is very short under typical conditions for performing the photo CVD process using the pulse laser beam such as excimer laser beam or the like. The improvement of this point can be realized by simultaneously irradiating plural pulse laser beams among which the phase of the second pulse row and thereafter is delayed to that of first pulse row or which have different frequencies. Furthermore, the improvement of the film quality can be realized by irradiating plural pulse laser beams having mutually shifted irradiation times.

That is, a third aspect of the invention is characterized in that in the photo CVD process using a pulse laser beam, a source gas is introduced into a CVD reaction chamber placing a substrate therein and a pulse row of a first laser beam and at least one pulse row of a second laser beam and thereafter having a different phase to the first pulse row are simultaneously irradiated thereto to improve the deposition rate and film quality.

A fourth aspect of the invention is characterized in that a source gas and an additive gas are introduced into a reaction chamber placing a substrate therein and at least one light having a wavelength or wavelength range absorbed by the additive gas and/or source gas is irradiated to the additive gas and/or source gas or further the substrate to perform the film formation.

Here, the source gas means a gas containing a component for the film to be formed.

As the source gas is adaptable a gas containing at least one gas selected from hydrocarbons, oxygen-containing hydrocarbons, halogenated hydrocarbons, silane series gases and so on. Here, the hydrocarbons mean $CH_4$, $C_2H_6$, $C_2H_4$, $C_2H_2$, $C_6H_6$ and the like, and the oxygen-containing hydrocarbons mean alcohols, aldehydes, carboxylic acids, ethers, ketones, esters, sugars and the like, and the halogenated hydrocarbons mean $CH_3Cl$ and the like, and the silane series gases mean $SiH_4$, $Si_2H_6$, $SiHCl_3$, $SiCl_4$ and the like.

Moreover, the source gas may contain a gas other than the additive gas mentioned later and an inert dilution gas such as $H_2$, He, Ar or the like in addition to the above mentioned gas containing the component for the film to be formed.

Next, the additive gas means a gas producing radicals by absorbing a light with a wavelength of not lower than 185 nm and promoting decomposition and film forming reaction of the source gas by excitation and decomposition of the additive gas itself. As the additive gas, at least one gas selected from halogen molecules such as $F_2$, $Cl_2$ and so on, halogen-containing molecules such as HBr, NOCl and so on, and oxygen-containing molecules such as $N_2O$, $H_2O_2$ and so on is advantageously adaptable.

Furthermore, the light means a continuous light emitted from a light source of a low pressure mercury lamp, a high pressure mercury lamp, a deuterium lamp, a xenon lamp, an argon ion laser and the like, and a pulse laser beam emitted from a discontinuous light source typified by an excimer laser or the like.

In the practice of the fourth invention, it is advantageous to irradiate the pulse laser beam and/or the continuous light in parallel to the surface of the substrate.

The first and second inventions are a method capable of providing a good film while utilizing the merits of the photo CVD process. That is, in order to improve the deposition rate, the pulse laser beam and the continuous light which has a large power are simultaneously irradiated (see FIG. 3).

In the photo CVD process using only the pulse beam, a short time of irradiation and a long time of non-irradiation are alternately repeated and the reaction is not constant. That is, the variations in the radical concentrations in CVD gas are very large because of repetition of photo reaction→dark reaction →photo reaction→dark reaction, and consequently radical-radical reaction, radical-molecule reaction and film forming reaction are complicatedly entangled in the reaction inside the CVD reaction chamber to cause the degradation of the film quality.

In the first invention, the photochemical reaction is always continued in the vicinity of the substrate inside the CVD reaction vessel without performing the cycle of light→dark→light→dark.

In the second invention, the continuous light is irradiated to the vicinity of the substrate or the substrate or the film layer formed on the substrate during cycles of light→dark→light→dark in the CVD reaction vessel, whereby the photochemical reaction is carried out in the vicinity of the substrate or on the substrate or in the film layer formed on the substrate to improve the film quality.

The following three items are realized by irradiating the continuous light to the vapor phase components in the vicinity of the substrate or the substrate or the film layer formed on the substrate:

(1) When irradiating the continuous light having a wavelength absorbed by the vapor phase components in the vicinity of the substrate, such vapor phase components are decomposed in the vicinity of the substrate to produce active chemical species reacting with the outermost surface layer of the film previously deposited, whereby molecules or atoms can be etched which are not stably included in the lattice of the outer film surface layer and resulted in the degradation of the film quality.

(2) When the continuous light having a wavelength absorbed by the film layer or the product on the substrate is directly irradiated to the substrate, the photolytical reaction of molecules included in the film in the form of particle or cluster can be generated to improve the film quality.

(3) When the continuous light having a wavelength absorbed by molecules to be removed from the film forming molecules is directly irradiated to the substrate, atoms or molecules which are restrained to the film through a weak bond but not included in the bonding lattice of the film can be dissociated to improve the film quality.

Moreover, the pulse laser beam used in the first and second inventions includes a case of irradiating plural pulse laser beams in addition to the irradiation from a single laser.

Furthermore, the third invention is a method capable of increasing the deposition rate to obtain the good film quality while holding the merits of the photo CVD process. That is, it is intended that another plural pulse laser beams are irradiated to the source gas on the substrate or to the substrate in a time of long light non-irradiation between a pulse and the next pulse in the first pulse row.

The following three functions are produced in accordance with the manner of the second pulse row to the first pulse row.

(1) As shown in FIG. 4(a), the delayed pulse lights of the second and thereafter are irradiated during the proceeding of the successive reactions of radicals in the vapor phase produced by the first pulse just after the irradiation of the first pulse, whereby the successive reactions forming powder inconvenient for the formation of film can be suppressed. Further, the reactions effective for the film formation can be accelerated to improve the film quality. The wavelength of the second pulse laser beam and thereafter is not necessarily the same as the wavelength of the first pulse beam and is selected from wavelengths decomposing an unfavorable product for the film formation by-produced in the successive reactions or being absorbed by the film layer formed on the substrate. The delaying time is set to a time during the successive reactions after the completion of the first pulse irradiation, i.e. from 20 ns to 1 ms.

(2) As shown in FIG. 4(b), when the second pulse laser beam and thereafter are irradiated in a time until a new source gas is transferred and diffused after the source gas is decomposed and consumed by the first pulse laser beam at a region of generating the photolytical reaction near to the substrate, the film formation through the second pulse beam and thereafter contributes to the whole deposition rate, whereby the deposition rate is increased as compared with the case of using the first pulse laser alone. In this case, the wavelength of the second laser beam and thereafter is not necessarily the same as that of the first laser beam. However, it is necessary that the source gas is decomposed in the wavelength of them.

(3) Although the frequency of the second pulse beam and thereafter is the same as the frequency of the first laser beam in the above items (1) and (2), the frequencies of plural pulse laser beams are not intentionally matched in this item (see FIG. 4(c)). For example, when using pulse laser beams of 100 Hz and 80 Hz, the phenomenon as a combination of the above items (1) and (2) appears and improvement of the deposition rate and film quality is observed.

Moreover, the third invention is characterized in that plural second pulse rows are irradiated as a pulse having a phase different from that of the first pulse row and does not particularly intend to limit the irradiation directions of all laser beams. In other words, it is not required to irradiate the laser beam only to the source gas or to the substrate or the film layer on the substrate.

Then, the fourth invention is a method of further introducing the additive gas into the reaction vessel. For example, when $SiH_4$ is used as a source gas to form a-Si film on the substrate, even if using a light source only by which the photochemically stable $SiH_4$ is not decomposed, $Cl_2$ is added as an additive gas to $SiH_4$ and a high pressure mercury lamp or XeCl excimer laser beam (wavelength 308 nm) is irradiated to these gases, whereby the decomposition of $SiH_4$ can be started. In this case, the main elementary reactions are shown by the following equations (1) and (2).

$$Cl_2 + h\nu \rightarrow 2Cl \qquad (1)$$

$$SiH_4 + Cl \rightarrow HCl + SiH_3 \qquad (2)$$

The thus produced $SiH_3$ radical directly takes part in the film formation and at the same time exhibits a chain reaction (chain length 500) represented by the following equation (3), whereby the decomposition of $Cl_2$ as well as the decomposition of $SiH_4$ (source gas) are promoted to increase the deposition rate. That is, energy of the lights can be utilized efficiently.

$$Cl_2 + SiH_3 \rightarrow Cl + SiH_3Cl \qquad (3)$$

Furthermore, if it is intended to industrially synthesize diamond film by using $CH_4$ through the photo CVD process, when the ordinary excimer laser, high or low pressure mercury lamp or the like is used as a light source, $CH_4$ is not decomposed which has not the absorption range involving the same wavelength as the light source. While, a vacuum ultraviolet light source having a short wavelength capable of causing the decomposition is weak in the output and also all light passages should be under vacuum, so that the industrial execution is unfavorable.

However, when $CH_4$ is mixed, for example, with $Cl_2$ and a high output ultraviolet ray such as XeCl excimer laser beam (wavelength 308 nm) is irradiated thereto, diamond film can be synthesized. In this case, the reactions are as follows.

$$Cl_2 + h\nu \rightarrow 2Cl \qquad (4)$$

$$Cl + CH_4 \rightarrow CH_3 + HCl \qquad (5)$$

$$Cl_2 + CH_3 \rightarrow CH_3Cl + Cl \qquad (6)$$

In the above reaction equation (6), $CH_3$ radical promotes the decomposition of $Cl_2$ and chain-reactingly accelerates the decomposition of $CH_4$ (chain length 1,000) to produce $CH_3Cl$, $CH_2Cl_2$, $CHCl_3$, $CCl_4$ and the like in the vapor phase. The absorption end in the ultraviolet region is 150 nm for $CH_4$ and shifts to a longer wavelength as the number of chlorine substitutes increases, and $CCl_4$ reaches to 250 nm. Finally, the primarily produced $CH_3$ radical and $CH_2$ and $CH$ radicals produced by the photolytical reaction of the secondary products contribute to the synthesis of diamond film.

Moreover, the film formation is similarly observed even by the irradiation of a continuous light through high pressure mercury lamp instead of the XeCl laser beam.

Even when these chlorine substituted methane derivatives are used alone, if ArF excimer laser beam (wavelength 193 nm) is, for example, irradiated thereto, a film including the diamond structure can also be synthesized. The main photolytical process of $CH_3Cl$ is shown by the following equation (7).

$$CH_3Cl + h\nu \rightarrow CH_3 + Cl \qquad (7)$$

The resulting Cl atom initiates a radical reaction with $CH_3Cl$, whereby plural $CH_3Cl$ molecules are decomposed by a single photon, so that the highly efficient utilization of light energy can be observed.

On the other hand, when $N_2O$ is used as an additive gas, an excimer laser beam (wavelength 193 nm) is, for example, used for decomposing $N_2O$. $N_2O$ is decomposed according to the following equation (8), and in this case the resulting oxygen atom decomposes the source gas.

$$N_2O + h\nu \rightarrow O + N_2 \qquad (8)$$

For instance, when it is coexistent with $CH_4$, the abstraction reaction by oxygen atom is caused, and in this case the resulting OH radical decomposes the parent molecule to produce $CH_3$ radical and the like and perform the film formation as shown in the following equations (9) and (10).

$$CH_4 + O \rightarrow CH_3 + OH \qquad (9)$$

$$CH_4 + OH \rightarrow CH_3 + H_2O \qquad (10)$$

When $SiH_4$ is a source gas, $N_2O$ is an additive gas and a light having a wavelength of 193 nm is irradiated, a-Si film can be synthesized. This is based on the fact that H atom is abstracted by the resulting O atom as a result of the photolysis as shown in the following equations (11) and (12). Similarly, the resulting OH radical also causes the hydrogen abstracting reaction.

$$SiH_4 + O \rightarrow SiH_3 + OH \qquad (11)$$

$$SiH_4 + OH \rightarrow SiH_3 + H_2O \qquad (12)$$

In this case, it is desirable that a ratio of $[N_2O]/[SiH_4]$ is not more than 10. If the ratio is much higher than 10, for example, $[N_2O]/[SiH_4] \approx 230$ as reported by P. K. Boyer, $SiO_2$ film is produced (Appl. Phys Lett. 40, 716 (1982)). In this case, $N_2O$ serves as a source gas but does not serve as an additive gas defined in the invention.

When coexisting with the additive gas of radical reactivity, the reaction with molecules adsorbed by the substrate in the film formation is caused to etch the deposited film, whereby the improvement of the film quality can be attained.

For instance, if it is intended to form the diamond film, it was indispensable to take a process of supplying an excessive energy to the surface of the film through a chemical species or the like having a surplus amount of energy by means of accelerated particles or plasma or heat filament in view of the prevention of graphitization. However, this process gives a damage to the substrate and the like and has a drawback that the substrate temperature should be raised.

In the photo CVD process, it is considered that $CH_x$ ($x=1, 2, 3$) radical is difficult to naturally store the surplus energy enough to cut C-H bond into the vibration mode after the arrival to the substrate, but when a chemical species having a large abstraction reactivity for H atom such as Cl atom, O atom or the like is produced and coexisted in the vicinity of molecular species adsorbed on the substrate, the H content in the formed film is reduced and at the same time the new C—C bonds forming a skeleton of the diamond structure are created, whereby the film quality and deposition rate can be improved.

BEST MODE OF CARRYING OUT THE INVENTION

Example 1

Figure 1:
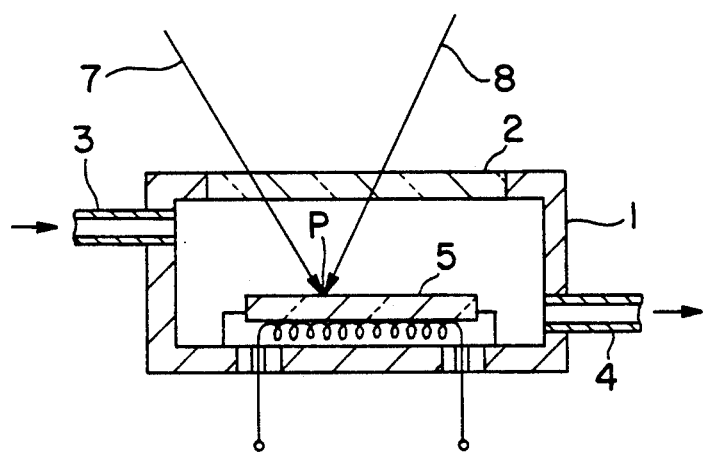
FIG. 1 is a sectional view illustrating the conventional photo CVD process through irradiation of plural laser beams.
Figure 2:
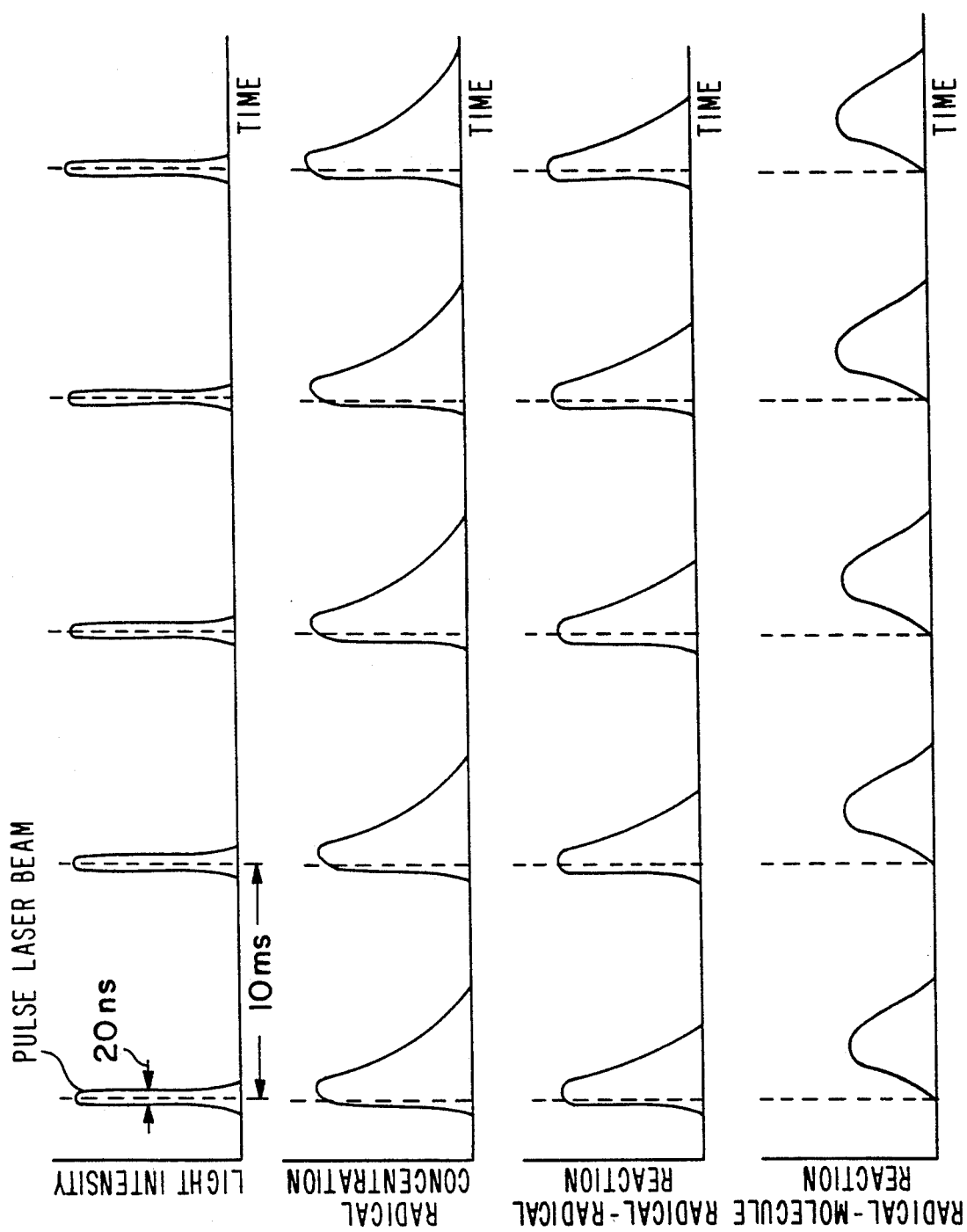
FIGS. 2a, b, c and d are graphs showing a reaction analysis of pulse laser CVD.
Figure 3:
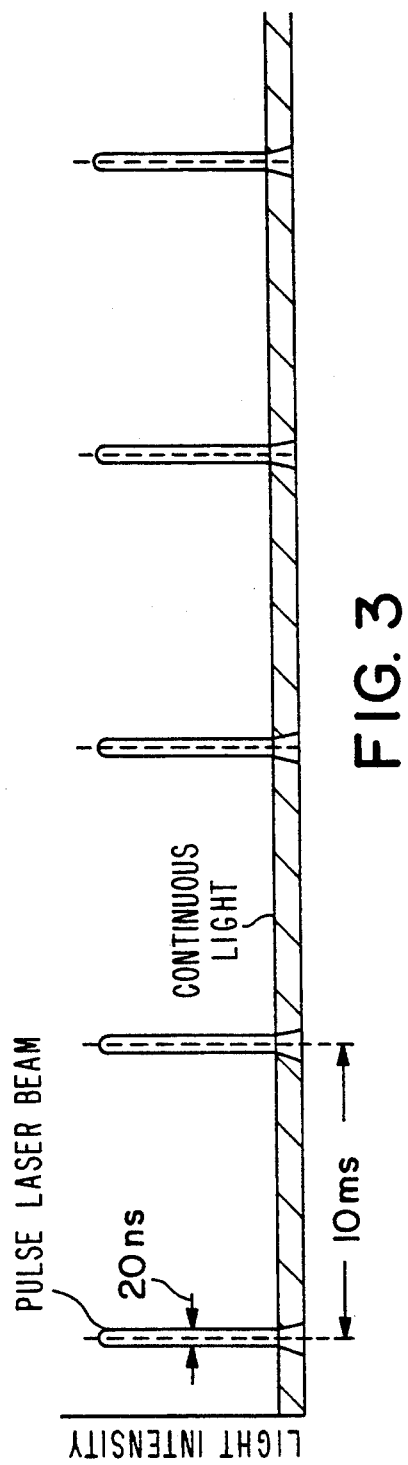
FIG. 3 is a graph illustrating a photo CVD process through irradiation of plural pulse laser beams and continuous light according to the invention.
Figure 4A:
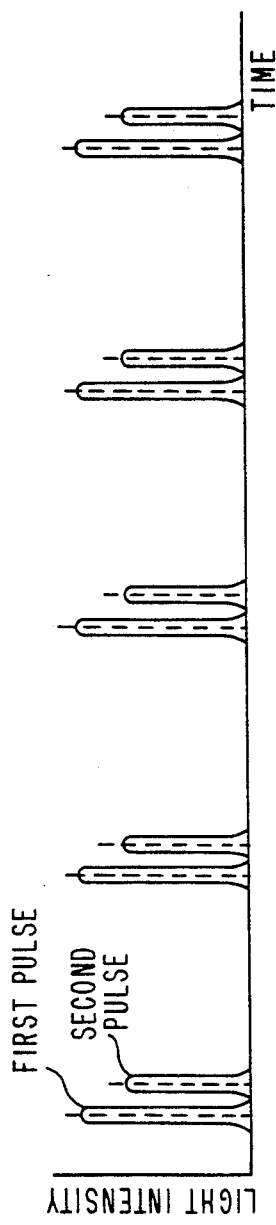
FIGS. 4a, b, and c are graphs illustrating a photo CVD process through irradiation of plural pulse rows having different phases according to the invention.
Figure 4B:
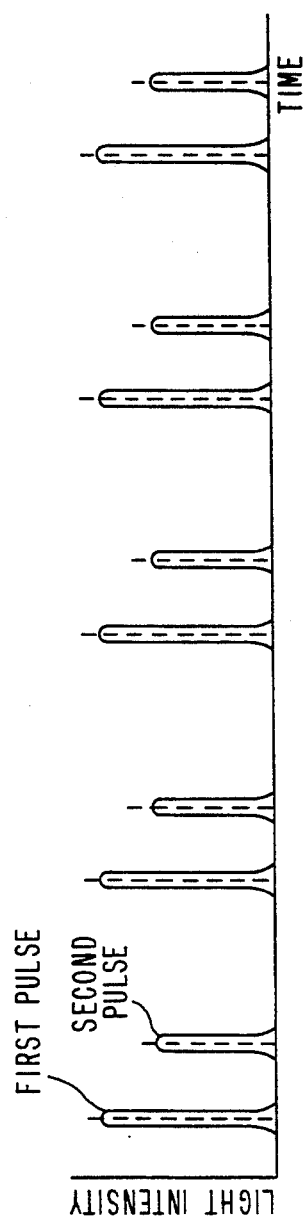
Figure 4C:
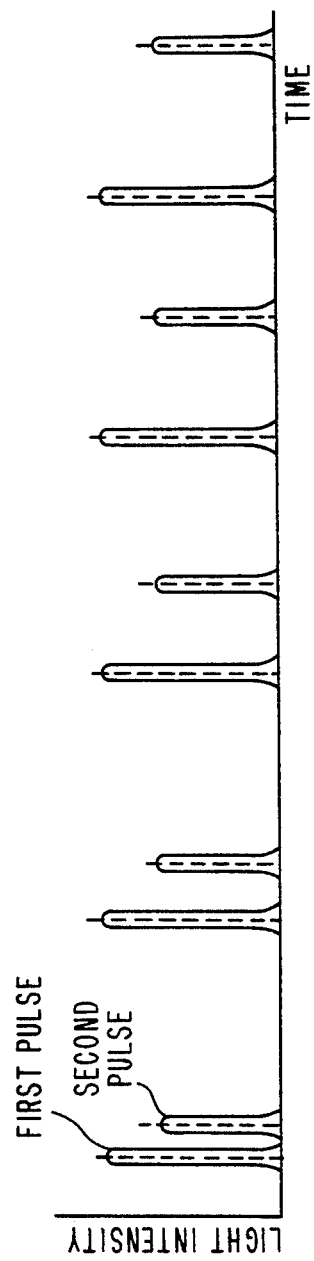

To $Mo(CO)_6$ having an absorption end of 300 nm was irradiated a KrF excimer laser beam with a wavelength of 248 nm alone. On the other hand, a light of a high pressure mercury lamp of 1 kW was irradiated to the vicinity of a substrate together with the same KrF excimer laser beam. In any case, Mo film was formed. The film formed by the latter method was better in the morphology and the conductivity because the specific resistance was 40 $\mu\Omega\cdot$cm. The specific resistance of the former case was 600 $\mu\Omega\cdot$cm.

Moreover, the CVD conditions were as follows.
substrate: quartz
source gas and pressure: $Mo(CO)_6$, 0.6 Torr
substrate temperature: room temperature
irradiating time: 1 minute
deposition rate: 1,000 Å

Example 2

An ArF excimer laser beam having a wavelength of 193 nm was irradiated to a mixed source gas of $SiH_4$ having an absorption end of 170 nm and $TiCl_4$ having an absorption end of 320 nm to obtain $TiSi_2$ film. The specific resistance of the film was 500 $\mu\Omega\cdot$cm.

When a light of a high pressure mercury lamp was simultaneously irradiated thereto, $TiSi_2$ film could be also formed, whose film quality was more excellent. The composition ratio was Ti:Si=1:2, and the film was crystallized and was excellent in the surface morphology. The specific resistance was 30~40 $\mu\Omega\cdot$cm.

Moreover, the CVD conditions were as follows.
substrate: $SiO_2$
partial pressure of source gas: $SiH_4$: 30 mTorr $SiCl_4$: 15 mTorr
total pressure: 3 Torr
flow rate: 80 sccm
substrate temperature: 300° C.
deposition rate: 200 Å/min

Example 3

An ArF excimer laser beam was horizontally irradiated to a mixed source gas of $Si_2H_6$ and $O_2$ to form a film of $SiO_2$.

Furthermore, lights of heavy hydrogen lamp and xenon lamp were simultaneously irradiated to the substrate in addition to the above irradiation, whereby a film having a good film quality was obtained.

The contents of SiH, SiOH, $SiO_3$ in the film obtained by the latter method were reduced as compared with the former case. As measured by a pinhole density monitor, the pinhole density was 22/cm² in the former case and 1/cm² in the latter case.

The breakdown voltage was 5.5 MV/cm in the former case and 9.5 MV/cm in the latter case.

The main cause of producing the improvement of the film quality is considered due to the fact that $O_2$ in the vicinity of the substrate and the resulting $O_3$ are decomposed by the continuous light to produce O atom, which reacts with the surface layer of the film to abstract molecules or atoms having a weak bond with the surface, or that $O_2$ and $O_3$ species adsorbed in the substrate or film molecules on the substrate are decomposed and at the same time molecules or atoms not located in a stable lattice structure are removed and O atoms simultaneously and efficiently move to a position of oxygen defect to improve the composition ratio as $SiO_2$.

Example 4

The film formation of $Al_2O_3$ was carried out by using $Al(CH_3)_3$ and $N_2O$ as a source gas.

Using an ArF laser beam (wavelength 193 nm) and a KrF laser beam (wavelength 248 nm) or another ArF laser beam, photo CVD was carried out, wherein the delaying time between two pulse laser beams was 5 ms or 100 $\mu$s, while each laser beam alone was taken as a comparative example.

The impurity, specific resistance and pinhole density of the resulting film were measured to obtain the results as shown in Table 1.

Moreover, the CVD conditions were as follows.
frequency of pulse laser beam: 100 Hz
irradiation direction: irradiation in parallel to substrate surface at 1 mm above substrate
$Al(CH_3)_3$: 100 sccm
$N_2O$: 800 sccm
He: 100 sccm (purging of entrance window)
total pressure: 1 torr
substrate: polycrystalline silicon
substrate temperature: 300° C.
deposition time: 1 hour As shown in the results of Table 1, it is obvious that the deposition rate and film quality are improved by the irradiation of plural pulse delayed laser beams proposed in the invention.

TABLE 1

| | Irradiated wavelength (mm) | | | | | |
|---|---|---|---|---|---|---|
| | Comparative Example | | Example | | | |
| | 193 | 248 | 193 + 193 | 193 + 193 | 193 + 248 | 193 + 248 |
| Delaying time | — | — | 5 ms | 100 μs | 5 ms | 100 μs |
| Deposition rate (μm/h) | 6.2 | 2.4 | 15.0 | 9.5 | 9.8 | 8.9 |
| Impurity (carbon) % | 1.2 | 3.2 | 0.9 | 0.6 | 1.0 | 0.5 |
| Specific resistance (Ωcm) | $10^{11}$ | $10^{10}$ | $10^{12}$ | $10^{13}$ | $10^{12}$ | $10^{13}$ |
| Pinhole density (/cm²) | 2 | 7 | <1 | <1 | <1 | <1 |

Example 5

In a reaction vessel wherein a substrate was arranged on a susceptor held at 350° C. were introduced a source gas or a source gas and an additive gas, whereby the total pressure inside the reaction vessel was adjusted to 10 Torr. Then, the film formation through photo CVD process wherein a laser beam was horizontally irradiated at a position of 1 mm above the substrate was carried out by combining the source gas, additive gas and laser beam as shown in Table 2. Moreover, the substrate was an Si plate and the frequency of pulse laser beam was 100 Hz. The resulting film was examined by a laser Raman spectroscopy, an X-ray diffraction and an electron beam diffraction to obtain the results as shown in Table 2.

was observed through the irradiation of ArF laser beam having a wavelength of 193 nm, while in the acceptable example 6, the formation of DLC film was observed by adding $N_2O$ to $C_2H_2$ under the same laser irradiation. As shown in the comparative example 4, the remarkable improvement by the addition of $H_2$ alone was not observed.

$CH_3Cl$ used as a source gas in the acceptable example 4 is a reaction intermediate produced in the acceptable examples 2 and 3, which showed the possibility of film formation even when it was used as a source gas. In the acceptable example 5 adding $Cl_2$ to $CH_3Cl$, a DLC film could be formed at a high speed by simultaneously irradiating pulse laser beams having wavelengths of 193 nm and 308 nm.

In the acceptable example 7 wherein $N_2O$ was added

TABLE 2

| | Source gas | | Additive gas | | | | | |
|---|---|---|---|---|---|---|---|---|
| | Kind | flow rate (sccm) | Kind | flow rate (sccm) | Light source | Deposits* | Deposition rate (μm/h) | Specific resistance (Ωm) |
| Comparative Example 1 | $CH_4$ | 20 | — | — | ArF | — | — | — |
| 2 | $C_2H_2$ | 20 | — | — | ArF | A, G | 2 | $10^5$ |
| 3 | $C_2H_4$ | 20 | — | — | ArF | A, G | 2 | $10^5$ |
| 4 | $C_2H_2$ | 20 | $H_2$ | 100 | ArF | A, G | 1 | $10^4$ |
| 5 | $C_6H_6$ | 20 | — | — | ArF | A, G | 2 | $10^5$ |
| Acceptable Example 1 | $CH_4$ | 20 | $N_2O$ | 20 | ArF | D, DLC | 5 | $10^{13}$ |
| 2 | $C_4$ | 20 | $Cl_2$ | 20 | ArF XeCl | D, DLC | 12 | $10^{14}$ |
| 3 | $CH_4$ | 20 | $Cl_2$ | 20 | ArF Hg lamp | D, DLC | 12 | $10^{14}$ |
| 4 | $CH_3Cl$ | 30 | — | — | ArF | D, DLC | 10 | $10^{14}$ |
| 5 | $CH_3Cl$ | 30 | $Cl_2$ | 20 | ArF XeCl | D, DLC | 13 | $10^{14}$ |
| 6 | $C_2H_2$ | 20 | $N_2O$ | 20 | ArF | D, DLC | 7 | $10^{13}$ |
| 7 | $C_6H_6$ | 20 | $N_2O$ | 20 | ArF | D, DLC | 12 | $10^{14}$ |
| 8 | $C_2H_2$ $H_2$ | 20 100 | $Cl_2$ | 2 | Arf XeCl | D, DLC | 7 | $10^{14}$ |
| 9 | $C_2H_2$ | 20 | — | — | ArF ArF | D, DLC | 5 | $10^7$ |

*A: amorphous carbon
G: graphite
D: diamond film
DLC: diamond-like carbon film

At first, when the acceptable examples 1, 2, 3 are compared with the comparative example 1 using $CH_4$ as a source gas, decrease of $CH_4$ was not observed even through the irradiation of the laser beam in the comparative example 1 and the film was not naturally formed, while a diamond-like carbon film (DLC) was formed in the acceptable example 1 containing the additive $N_2O$, the acceptable example 2 containing the additive $Cl_2$ and the acceptable example 3 containing the additive $Cl_2$ and irradiating a light of a mercury lamp as a continuous light from above the substrate.

In the comparative Example 2 using $C_2H_2$ as a source gas and the comparative example 4 adding $H_2$ as an additive gas to $C_2H_2$, the decomposition of graphite (G)

to $C_6H_6$ used as a source gas in the comparative example 5, considerable improvement of the quality in the diamond film was observed.

The acceptable example 8 is a case that $C_2H_2$ and $H_2$ were used as a source gas and $Cl_2$ was used as an additive gas. It is considered that Cl atom is produced by photolysis and immediately reacts with $H_2$ molecule to produce H atom according to the reactions of the following equations (A) and (B) and the resulting H atom serves to improve the film quality.

$$Cl + h\nu \text{ (308 nm)} \rightarrow 2Cl \tag{A}$$

$$Cl + H_2 \rightarrow HCl + H \quad (B)$$

In case of the acceptable example 8, since $[H_2] >> [Cl_2]$, there is no contribution of chain reaction as in $$H + Cl_2 \rightarrow HCl + Cl \quad (C)$$

and H atom is indirectly produced by the light irradiation. This H atom is guessed to serve the improvement of the film quality through the etching of graphite.

In the acceptable example 9, two ArF laser beams having a frequency of 100 Hz and different phases are irradiated at a height of 1 mm above the substrate so as to cross the irradiation directions with each other, so that the deposition rate is considerably improved and the specific resistance is increased.

INDUSTRIAL APPLICABILITY

According to the invention, the increase of the deposition rate and the considerable improvement of the film quality can be attained by simultaneously irradiating the pulse laser beam and the continuous light of large power. Furthermore, the increase of deposition rate and the considerable improvement of film quality are attempted by simultaneously irradiating a first pulse laser beam and a second delayed pulse laser beam. Moreover, the decomposition ratio of the source gas can be increased to efficiently utilize the expensive source gas, so that there is an effect of reducing the cost.

Further, according to the invention, the increase of the deposition rate and the considerable improvement of the film quality can be achieved by introducing a radical reactive additive gas in addition to the source gas under the light irradiation, and the deposition rate and the film quality can further be improved by introducing the radical reactive additive gas in addition to the source gas and simultaneously irradiating the pulse laser beam and the continuous light or simultaneously irradiating a first pulse laser beam and a second delayed pulse laser beam.

As mentioned above, according to the invention, semiconductor films and the like having higher quality and accuracy can efficiently be manufactured, so that the industrial contribution is large.

We claim:

1. A photochemical vapor deposition process using a plurality of pulsed laser beams having at least one wavelength, at least one of which wavelength is a wavelength that decomposes a source gas comprising:
   (a) introducing the source gas containing a component of a film to be formed on a substrate into a reaction vessel;
   (b) introducing said substrate into said reaction vessel;
   (c) irradiating said source gas in parallel to a surface of said substrate with pulses of a first laser beam to decompose said gas to produce radicals;
   (d) irradiating said radicals in parallel to the surface of said substrate with pulses of at least one other laser beam; and
   (e) forming the film by depositing the irradiated radicals of step (d);
   wherein the plurality of pulsed laser beams have the same pulse interval, and a delaying time of a pulse of said at least one other laser beam from a corresponding pulse of said first laser beam is from 20 ns to 1 ms during which a successive reaction of said radicals produced by the irradiation with said pulse of said first leaser beam proceeds.

2. A photochemical vapor deposition process using a plurality of pulsed laser beams having at least one wavelength that decompose a source gas comprising:
   (a) introducing the source gas containing a component of a film to be formed on a substrate into a reaction vessel;
   (b) introducing said substrate into said reaction vessel;
   (c) irradiating said source gas in parallel to a surface of said substrate with pulses of a first laser beam to decompose said gas to produce radicals;
   (d) irradiating additional source gas in parallel to the surface of said substrate with pulses of at least one other laser beam to decompose said additional gas to produce additional radicals; and
   (e) then forming the film by depositing the radicals from gases of steps (c) and (d);
   wherein the plurality of pulsed laser beams have the same pulse interval, and a delaying time of a pulse of said at least one other laser beam from a corresponding pulse of said first laser beam is a time during which said additional source gas is transferred and diffused into a region where photochemical reaction is generated near to said substrate after said source gas has been decomposed and converted to radicals by the irradiation of said pulse of said first laser beam.

* * * * *